United States Patent
Lai et al.

(10) Patent No.: US 9,590,139 B1
(45) Date of Patent: Mar. 7, 2017

(54) LIGHT EMITTING MODULE

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/174,812

(22) Filed: Jun. 6, 2016

(30) Foreign Application Priority Data

Nov. 9, 2015 (TW) .............................. 104136816 A

(51) Int. Cl.
*H01L 33/06* (2010.01)
*H01L 33/32* (2010.01)

(52) U.S. Cl.
CPC .............. *H01L 33/06* (2013.01); *H01L 33/32* (2013.01)

(58) Field of Classification Search
CPC ....................................................... H01L 33/06
See application file for complete search history.

(56) References Cited

U.S. PATENT DOCUMENTS

| | | | |
|---|---|---|---|
| 2013/0221368 A1* | 8/2013 | Oraw | H01L 27/15 257/76 |
| 2014/0124753 A1* | 5/2014 | Lee | H01L 51/5012 257/40 |
| 2014/0209930 A1* | 7/2014 | Weng | H01L 25/0753 257/88 |

* cited by examiner

*Primary Examiner* — Scott B Geyer
*Assistant Examiner* — S. M. S. Imtiaz
(74) *Attorney, Agent, or Firm* — J.C. Patents

(57) ABSTRACT

A light emitting module including a driving unit and a light emitting diode is provided. The light emitting diode is electrically connected to the driving unit and the driving unit provides an operating current to make the light emitting diode emit light. The light emitting diode includes an n-type semiconductor layer, a light-emitting layer, an electron-blocking layer, and a p-type semiconductor layer. The electron-blocking layer has a thickness, and the thickness is smaller than or equal to 30 nm or is larger than or equal to 80 nm. The light-emitting layer is located between the electron-blocking layer and the n-type semiconductor layer. The electron-blocking layer is located between the p-type semiconductor layer and the light-emitting layer. A ratio of current density of the light emitting diode to the thickness is larger than 0 and is smaller than or equal to 2.

16 Claims, 4 Drawing Sheets

LIGHT EMITTING MODULE

CROSS-REFERENCE TO RELATED APPLICATION

This application claims the priority benefit of Taiwan application serial no. 104136816, filed on Nov. 9, 2015. The entirety of the above-mentioned patent application is hereby incorporated by reference herein and made a part of this specification.

BACKGROUND OF THE INVENTION

Field of the Invention

The invention relates to a light emitting module, and relates particularly to a light emitting module having a light emitting diode.

Description of Related Art

With the evolution of photoelectrical technology, traditional incandescent bulbs and fluorescent lamps have been gradually replaced by light emitting diodes (LEDs). The light emitting diode has advantages such as long lifespan, small size, high shock resistance, high light efficiency and low power consumption. Therefore, the light emitting diode has been widely adopted in various types of different lighting applications.

However, at the current stage, the light emitting diode still faces many technical challenges, wherein an efficiency drop of the light emitting diode is one challenge thereof. More specifically, an operation range of the light emitting diode at a low current density corresponds to a peak of an external quantum efficiency. However, the external quantum efficiency decreases along with the increase in the current density of the light emitting diode. This phenomenon namely is the efficiency droop effect of the light emitting diode.

Generally speaking, the current density of the light emitting diode is typically at a high current density operation range in order to make the light emitting diode achieve a high light emitting brightness. Due to the aforementioned efficiency droop effect, the external quantum efficiency of the light emitting diode under the high current density operation range is limited and the luminous efficiency of the light emitting diode cannot be further enhanced. Therefore, how to achieve an ideal luminous efficiency for the light emitting diode under operation conditions of different current densities is a problem needing to be solved by researchers.

SUMMARY OF THE INVENTION

The invention provides a light emitting module having an ideal luminous efficiency.

The light emitting module according to an embodiment of the invention includes a driving unit and a light emitting diode. The light emitting diode is electrically connected to the driving unit and the driving unit provides an operating current to make the light emitting diode emit light. The light emitting diode includes an n-type semiconductor layer, a light-emitting layer, an electron-blocking layer, and a p-type semiconductor layer. The electron-blocking layer has a thickness, and the thickness is smaller than or equal to 30 nm or is larger than or equal to 80 nm. The light-emitting layer is located between the electron-blocking layer and the n-type semiconductor layer. The electron-blocking layer is located between the p-type semiconductor layer and the light-emitting layer. A ratio (ampere/square centimeter-nanometer) of a current density D (ampere/square centimeter) of the light emitting diode to the thickness t (nanometer) is larger than 0 and is smaller than or equal to 2.

In an embodiment of the invention, the current density falls in a range from 0.001 amperes/square centimeter to 4 amperes/square centimeter, and the thickness falls in a range from 2 nanometer to 30 nanometer.

In an embodiment of the invention, the light-emitting layer is a multiple quantum well structure, the multiple quantum well structure includes a plurality of quantum well layers and a plurality of quantum barrier layers alternately stacked, and the thickness falls in a range from 0.3 times to 8 times a thickness of a single quantum well layer.

In an embodiment of the invention, the ratio of the current density D to the thickness t falls in a range from 0.133 to 0.875, the current density falls in a range from 20 amperes/square centimeter to 70 amperes/square centimeter, and the thickness falls in a range from 80 nanometers to 150 nanometers.

In an embodiment of the invention, the light-emitting layer is a multiple quantum well structure, the multiple quantum well structure includes a plurality of quantum well layers and a plurality of quantum barrier layers alternately stacked, and the thickness falls in a range from 15 times to 40 times a thickness of a single quantum well layer.

In an embodiment of the invention, the current density corresponding to a peak value of a curve of an external quantum efficiency of the light emitting diode falls in a range from 0.01 amperes/square centimeter to 3 amperes/square centimeter.

In an embodiment of the invention, the light emitting diode is a micro light emitting diode, and a side length dimension of the micro light emitting diode falls in a range from 3 microns to 40 microns.

In an embodiment of the invention, an epitaxial defect density of the light emitting diode falls in a range from $10^3$/square centimeters to $10^8$/square centimeters.

In an embodiment of the invention, the current density corresponding to a peak value of a curve of the external quantum efficiency of the light emitting diode falls in a range from 3 amperes/square centimeter to 10 amperes/square centimeter.

In an embodiment of the invention, a side length dimension of the light emitting diode falls in a range from 0.2 millimeters to 2 millimeters.

In an embodiment of the invention, the light emitting diode includes a first electrode and a second electrode, the first electrode is electrically connected to the n-type semiconductor layer, the second electrode is electrically connected to the p-type semiconductor layer, and the driving unit is electrically connected to the n-type semiconductor layer and the p-type semiconductor layer by the first electrode and the second electrode, respectively.

In an embodiment of the invention, a material of the electron-blocking layer includes p-type aluminum gallium nitride.

In an embodiment of the invention, the electron-blocking layer is a superlattice structure.

In an embodiment of the invention, a material of the n-type semiconductor layer includes n-type gallium nitride.

In an embodiment of the invention, a material of the p-type semiconductor layer includes p-type gallium nitride.

In an embodiment of the invention, the light-emitting layer includes a plurality of indium gallium nitride layers and a plurality of gallium nitride layers alternately stacked.

Based on the above, in a light emitting module of an embodiment of the invention, a thickness of an electron-blocking layer in a light emitting diode of a light emitting module may be designed according to different operation ranges of the current density of the light emitting diode, to achieve a more ideal external quantum efficiency, further enhancing the luminous efficiency of the light emitting diode in the light emitting module. In this way, the light emitting diode in the light emitting module may have an ideal luminous efficiency under different operation ranges of the current density.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
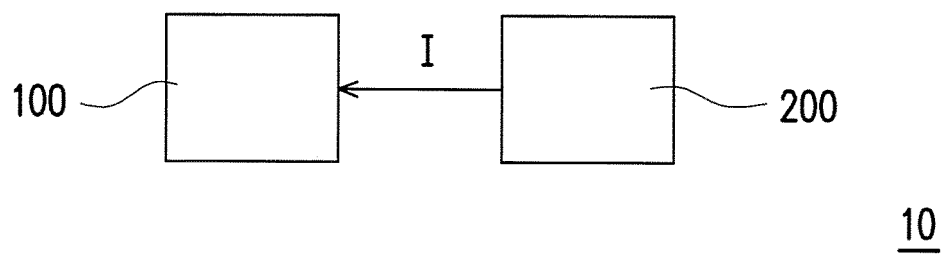
FIG. 1 is a schematic diagram illustrating a light emitting module according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating a light emitting module according to an embodiment of the invention. Referring to FIG. 1, a light emitting module 10 includes a light emitting diode 100 and a driving unit 200. The light emitting diode 100 is electrically connected to the driving unit 200, and the driving unit 200 provides an operating current I to make the light emitting diode 100 emit light via electroluminescence. It should be noted, in the present embodiment, only one light emitting diode is used as an example, however the number of light emitting diodes of the invention is not limited thereto.

It should be noted, the light emitting diode 100 may have different configurations. A configuration of the light emitting diode 100 of the present embodiment may be a lateral light emitting diode, a vertical light emitting diode or other different type of light emitting diode. Embodiments of a lateral light emitting diode and a vertical light emitting diode are described in the examples below.

Figure 2:
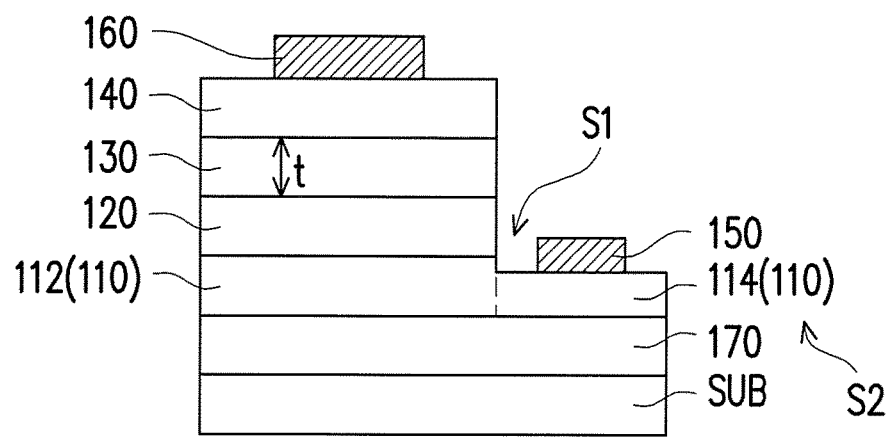
FIG. 2 and FIG. 3 are cross-sectional schematic diagrams illustrating a light emitting diode of a light emitting module according to different embodiments of the invention.

FIG. 2 is a cross-sectional schematic diagram illustrating a light emitting diode of a light emitting module according to an embodiment of the invention. Referring to FIG. 1 and FIG. 2 at the same time, in the present embodiment, the light emitting diode 100a of the light emitting module 10 is a lateral light emitting diode, and is a type of light emitting diode applicable to wire bond packaging or flip chip packaging. The light emitting diode 100a includes an n-type semiconductor layer 110, a light-emitting layer 120, an electron-blocking layer 130, a p-type semiconductor layer 140, a first electrode 150 and a second electrode 160. The electron-blocking layer 130 has a thickness t, wherein the thickness t is smaller than or equal to 30 nanometers or is greater than or equal to 80 nanometers. More specifically, the n-type semiconductor layer 110 includes a first part 112 and a second part 114, wherein the second part 114 extends out from the first part 112 and protrudes outside of an area of the light-emitting layer 120 and is electrically connected to the first electrode 150. The light-emitting layer 120 is located between the electron-blocking layer 130 and the n-type semiconductor layer 110, and the electron-blocking layer 130 is located between the p-type semiconductor layer 140 and the light-emitting layer 120. In other words, the light-emitting layer 120, the electron-blocking layer 130, the p-type semiconductor layer 140 are stacked on the first part 112 sequentially. The second electrode 160 is electrically connected to the p-type semiconductor layer 140. It should be noted, the light-emitting layer 120, the electron-blocking layer 130, the p-type semiconductor layer 140, the first electrode 150 and the second electrode 160 are located at a first side S1 of the n-type semiconductor layer 110. A ratio (ampere/square centimeter-nanometer) of a current density D (ampere/square centimeter) of the light emitting diode 100a to the thickness t (nanometer) is larger than 0 and is smaller than or equal to 2.

More specifically, the driving unit 200 is electrically connected to the first electrode 150 and the second electrode 160, wherein the driving unit 200 is electrically connected to the n-type semiconductor layer 110 and the p-type semiconductor layer 140 by the first electrode 150 and the second electrode 160, respectively. In this way, a current flowing direction of the operating current I provided by the driving unit 200 flows from the second electrode 160 to the p-type semiconductor layer 140, to the electron-blocking layer 130, to the light-emitting layer 120, to the n-type semiconductor layer 110, and to the first electrode 150 sequentially.

In the present embodiment, a material of the n-type semiconductor layer 110 may include an n-type II-VI group material (for example: n-type zinc selenide (ZnSe)) or n-type III-V nitride containing material (for example: n-type gallium nitride (GaN), n-type aluminum nitride (AlN), n-type indium nitride (InN), n-type indium gallium nitride (InGaN), n-type aluminum gallium nitride (AlGaN) or n-type aluminum indium gallium nitride (AlInGaN), preferably n-type gallium nitride (n-GaN) layer). A material of the p-type semiconductor layer 140 may include a p-type II-VI group material (for example: p-type zinc selenide (ZnSe)) or p-type III-V nitride containing material (for example: p-type gallium nitride (GaN), p-type aluminum nitride (AlN), p-type indium nitride (InN), p-type indium gallium nitride (InGaN), p-type aluminum gallium nitride (AlGaN) or p-type aluminum indium gallium nitride (AlInGaN), preferably p-type gallium nitride (p-GaN) layer).

Referring to FIG. 2 again, in more detail, the light emitting diode 100a of the present embodiment further includes a buffer layer 170 and a substrate SUB, wherein the buffer layer 170 and the substrate SUB are located on a second side S2, which is opposite the first side S1, of the n-type semiconductor layer 110, and the buffer layer 170 is located between the n-type semiconductor layer 110 and the substrate SUB. A material of the substrate SUB, for example, is a sapphire substrate, silicon, silicon carbide (SiC), gallium arsenide (GaAs), glass, ceramic or other materials having lattice structures matching the lattice structure of the n-type semiconductor layer 110. In addition, a single crystal compound with a lattice constant close to the lattice constant of the n-type semiconductor layer 110 is also suitable as a material of the substrate SUB, for example, a gallium nitride (GaN) substrate. The buffer layer 170 is used to provide stress relief and improve the epitaxial quality of a subsequently formed thin film, wherein a material of the buffer layer 170, for example, includes unintentionally doped gallium nitride (u-GaN).

In an embodiment, a structure of the light-emitting layer 120, for example, is a multiple quantum well (MQW) structure, wherein the multiple quantum well structure includes a plurality of quantum well layers and a plurality of quantum barrier layers alternately stacked. This design may effectively increase the luminous efficiency of the light emitting diode 100a. Generally speaking, a thickness of the quantum barrier layer is greater than a thickness of the quantum well layer, wherein the thickness of each of the quantum well layers falls in a range from 1 nanometers to 8 nanometers, and the thickness of each of the quantum barrier layers falls in a range from 5 nanometers to 15 nanometers. More specifically, a material of the light-emitting layer 120, for example, includes a plurality of indium gallium nitride layers and a plurality of gallium nitride layers alternately stacked. The light-emitting layer 120 may be made to emit different light-emitting wavelength ranges by designing the proportion of indium or gallium in the light-emitting layer 120. In other embodiments, a structure of the light-emitting layer 120, for example, is a single quantum well (SQW) structure. It should be noted, the aforementioned material of the light-emitting layer 120 is only an example and a material of the light-emitting layer 120 is not limited to indium gallium nitride and gallium nitride.

In the present embodiment, because the electron-blocking layer 130 is disposed between the p-type semiconductor layer 140 and the light-emitting layer 120, the configuration may more effectively block the electrons emitted by the n-type semiconductor layer 110 from moving towards the p-type semiconductor layer 140 such that more electrons and holes are confined in the light-emitting layer 120 to increase a probability of the electron hole recombining, and increasing the luminous efficiency of the light emitting diode 100a. More specifically, in the present embodiment, a bandgap of the electron-blocking layer 130 is greater than a bandgap of the light-emitting layer 120. A material of the electron-blocking layer 130, for example, includes p-type gallium nitride (GaN), p-type aluminum nitride (AlN), p-type aluminum gallium nitride (AlGaN) or p-type aluminum indium gallium nitride (AlInGaN), preferably p-type aluminum gallium nitride, however the invention is not limited thereto. In addition, the electron-blocking layer 130 is a superlattice structure.

It should be noted here, in the embodiments below, the same reference numbers are used in the drawings and the description to refer to the same or like parts. Description of the same technical content is omitted. Regarding the same parts, reference may be made to content in the aforementioned embodiment and will not be repeated here.

Figure 3:
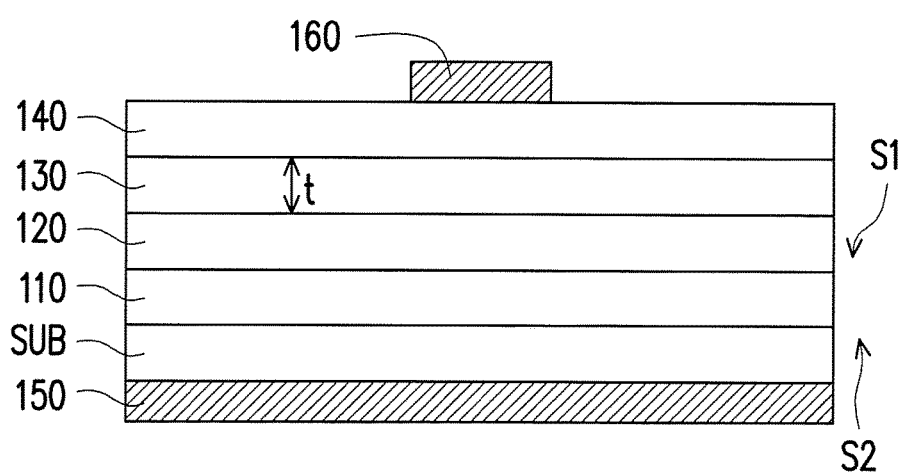

FIG. 3 is a cross-sectional schematic diagram illustrating a light emitting diode of a light emitting module according to an embodiment of the invention. In the present embodiment, a light emitting diode 100b of the light emitting module 10 is similar to the light emitting diode 100a illustrated in FIG. 2. A main difference between the two lies in: the light emitting diode 100b is a vertical light emitting diode, wherein the first electrode 150 is located at the second side S2, and the light-emitting layer 120, the electron-blocking layer 130, the p-type semiconductor layer 140 and the second electrode 160 are located at the first side S1. Next, in the present embodiment, the substrate SUB is located between the n-type semiconductor layer 110 and the first electrode 150, wherein the substrate SUB may be a conductive substrate. In other words, the first electrode 150 and the n-type semiconductor layer 110 are disposed on two opposite surfaces of the substrate SUB, respectively.

Figure 4:
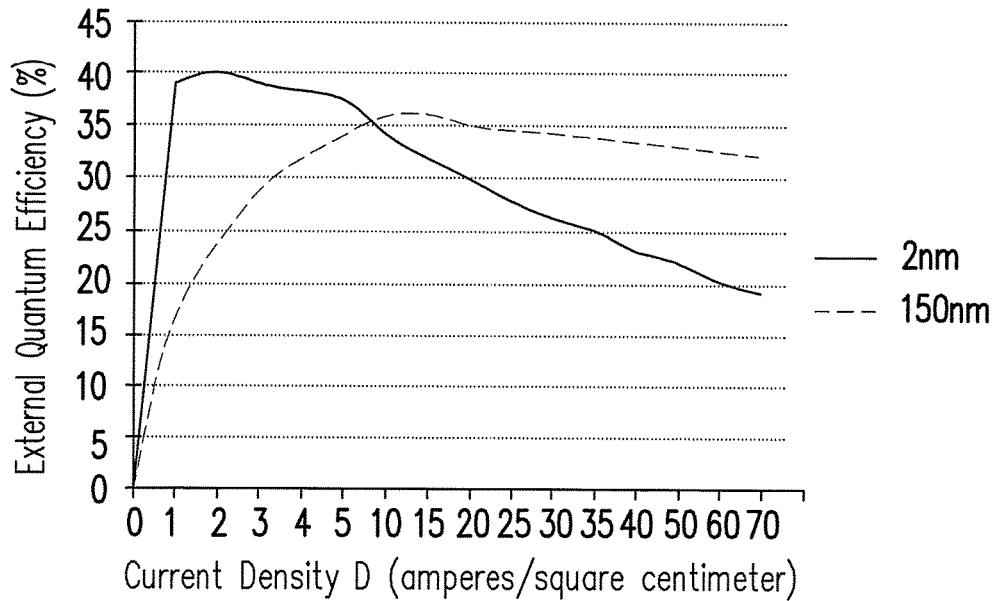
FIG. 4, FIG. 5 and FIG. 6 are diagrams illustrating a relationship between an external quantum efficiency of a light emitting diode of a light emitting module and a current density of a light emitting diode according to different embodiments of the invention.

FIG. 4 is a diagram illustrating a relationship between an external quantum efficiency of a light emitting diode of a light emitting module and a current density of a light emitting diode according to a different embodiment of the invention. In the different embodiment illustrated in FIG. 4, the solid line illustrated in FIG. 4 represents a diagram illustrating a relationship between an external quantum efficiency to a current density D corresponding to when the thickness t of the electron-blocking layer 130 of the light emitting diode is 2 nanometers; the dashed line illustrated in FIG. 4 represents a diagram illustrating a relationship between an external quantum efficiency to a current density D corresponding to when the thickness t of the electron-blocking layer 130 of the light emitting diode is 150 nanometers.

Referring to FIG. 4 again, when the current density D falls in an operation range from 0.001 amperes/square centimeter to 4 amperes/square centimeter, the light emitting diode having the thinner electron-blocking layer 130 of thickness t (2 nanometers) has a higher external quantum efficiency compared to the light emitting diode having the thicker electron-blocking layer 130 of thickness t (150 nanometers); and when the current density D falls in an operation range greater than 20 amperes/square centimeter, the light emitting diode having the thicker electron-blocking layer 130 of thickness t (150 nanometers) has a higher external quantum efficiency compared to the light emitting diode having the thinner electron-blocking layer 130 of thickness t (2 nanometers).

Therefore, under the operation range of the lower current density D (the operation range of 0.001 amperes/square centimeter to 4 amperes/square centimeter), the light emitting diode having the thinner electron-blocking layer 130 of thickness t (2 nanometers) has a higher external quantum efficiency compared to the light emitting diode having the thicker electron-blocking layer 130 of thickness t (150 nanometers); however, under the operation range of the higher current density D (the operation range of 20 amperes/square centimeter to 70 amperes/square centimeter), the external quantum efficiency of the light emitting diode having the thinner electron-blocking layer 130 of thickness t (2 nanometers) drops faster along with an increase of the current density D. In other words, along with an increase of the current density D, the effect of the efficiency droop is more obvious in the external quantum efficiency of the light emitting diode having the thinner electron-blocking layer 130 of thickness t (2 nanometers). On the other hand, under the operation range of the lower current density D (the operation range of 0.001 amperes/square centimeter to 4 amperes/square centimeter), the light emitting diode having the thicker electron-blocking layer 130 of thickness t has a lower external quantum efficiency compared to the light emitting diode having the thinner electron-blocking layer 130 of thickness t; however, under the operation range of the higher current density D (the operation range of 20 amperes/square centimeter to 70 amperes/square centimeter), the external quantum efficiency of the light emitting diode having the thicker electron-blocking layer 130 of thickness t is higher and the external quantum efficiency drops slower along with an increase of the current density D. In other words, along with an increase of the current density D, the effect of the efficiency droop in the external quantum efficiency is not as obvious. Therefore, the light emitting diode having the thinner thickness for the electron-blocking layer 130 is suitable for the lower current density D operation range (0.001 amperes/square centimeter to 4 amperes/square centimeter range), and the light emitting diode having the thicker thickness for the electron-blocking layer 130 is suitable for the higher current density D operation range (20 amperes/square centimeter to 70 amperes/square centimeter range).

Figure 5:
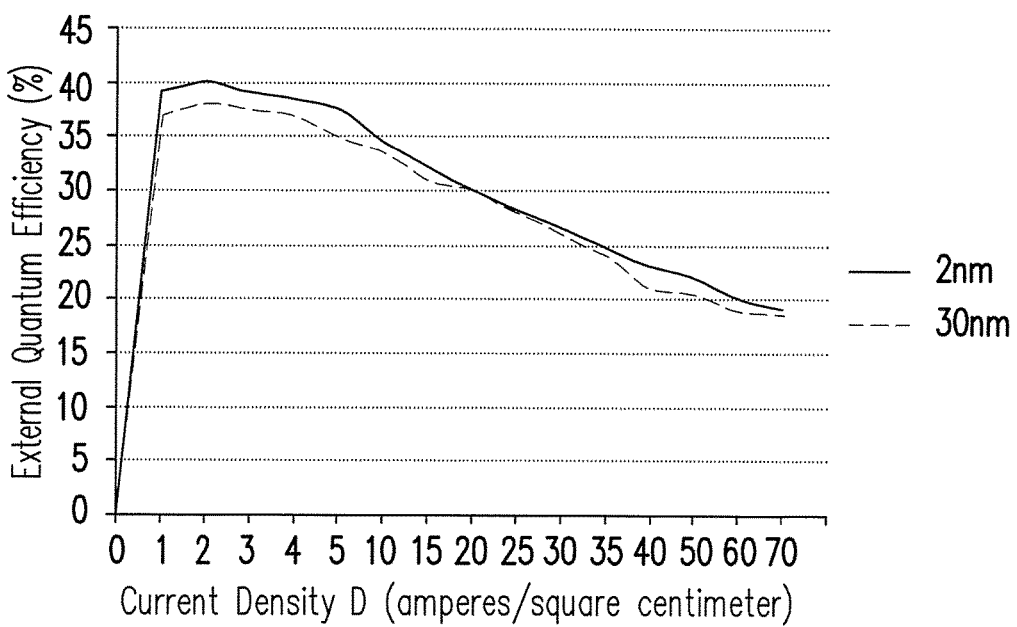

FIG. 5 is a diagram illustrating a relationship between an external quantum efficiency of a light emitting diode of a light emitting module and a current density of a light emitting diode according to a different embodiment of the invention. In the different embodiment illustrated in FIG. 5, the solid line illustrated in FIG. 5 represents a diagram illustrating a relationship between an external quantum efficiency to a current density D corresponding to when the thickness t of the electron-blocking layer 130 of the light emitting diode is 2 nanometers; the dashed line illustrated in FIG. 5 represents a diagram illustrating a relationship between an external quantum efficiency to a current density D corresponding to when the thickness t of the electron-blocking layer 130 of the light emitting diode is 30 nanometers. First, as may be seen from FIG. 5, overall, under different operation ranges of the current density, the performance situation of the external quantum efficiency for both the light emitting diode having the electron-blocking layer 130 of thickness t of 2 nanometers and the light emitting diode having the electron-blocking layer 130 of thickness t of 30 nanometers are similar. More specifically, under lower operation ranges of the current density D (0.001 amperes/square centimeter to 4 amperes/square centimeter range), the external quantum efficiency of both are higher; and under higher operation ranges of the current density D (20 amperes/square centimeter to 70 amperes/square centimeter range), the external quantum efficiency of both are lower. In addition, along with an increase in the current density D, the effect of the efficiency droop in the external quantum efficiency of both are more obvious. Therefore, the electron-blocking layer 130 of the light emitting diode having the thickness of the electron-blocking layer 130 falling in the 2 nanometer to 30 nanometer range is suitable for the lower current density operation range. Furthermore, the thickness t of the electron-blocking layer 130 may be designed corresponding to a thickness of the quantum well layer of the light-emitting layer 120. Preferably, the thickness t of the electron-blocking layer 130 falls in the range from 0.3 times to 8 times the thickness of a single quantum well layer (e.g. any one of the quantum well layers) of the light-emitting layer 120.

It is worthy to note, for the light emitting diode having the thickness t of the electron-blocking layer 130 falling in the range from 2 nanometers to 30 nanometers, the current density D corresponding to a peak value of a curve of the external quantum efficiency of the light emitting diode falls in the range from 0.01 amperes/square centimeter to 3 amperes/square centimeter. In addition, the light emitting diode corresponding to the aforementioned range is a micro light emitting diode, and the side length dimension of the micro light emitting diode falls in the range from 3 microns to 40 microns. On the other hand, the epitaxial defect density of the light emitting diode corresponding to the aforementioned range falls in the range from $10^3$/square centimeters to $10^8$/square centimeters.

Figure 6:
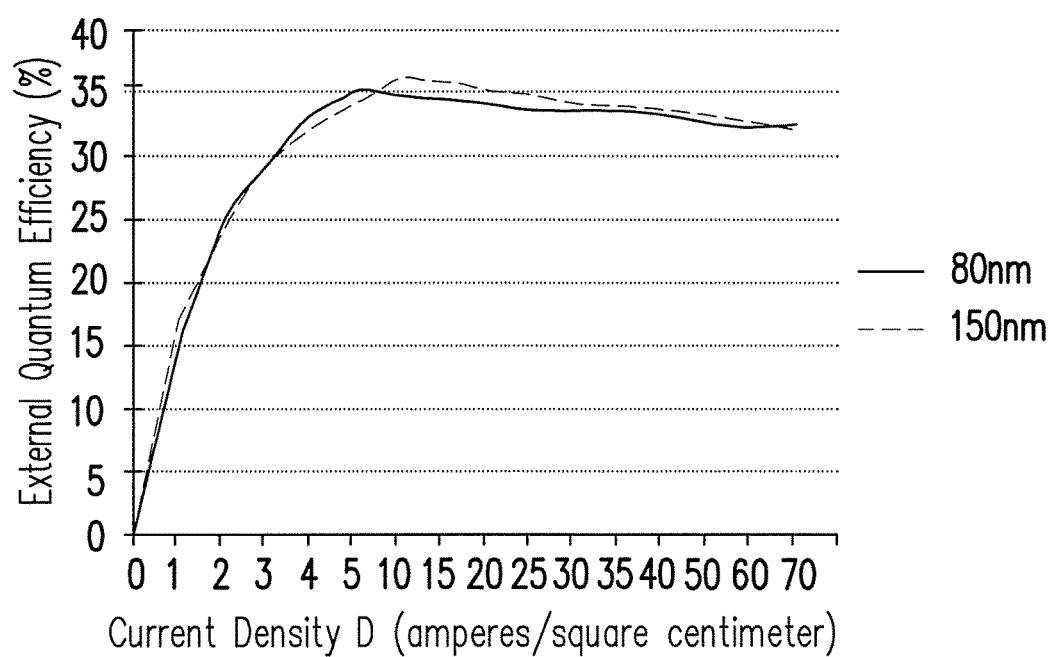

FIG. 6 is a diagram illustrating a relationship between an external quantum efficiency of a light emitting diode of a light emitting module and a current density of a light emitting diode according to a different embodiment of the invention. The solid line illustrated in FIG. 6 represents a diagram illustrating a relationship between an external quantum efficiency to a current density D corresponding to when the thickness t of the electron-blocking layer 130 of the light emitting diode is 80 nanometers; the dashed line illustrated in FIG. 6 represents a diagram illustrating a relationship between an external quantum efficiency to a current density D corresponding to when the thickness t of the electron-blocking layer 130 of the light emitting diode is 150 nanometers. First, as may be seen from FIG. 6, overall, under different operation ranges of the current density, the performance situation of the external quantum efficiency for both the light emitting diode having the electron-blocking layer 130 of thickness t of 80 nanometers and the light emitting diode having the electron-blocking layer 130 of thickness t of 150 nanometers are similar. More specifically, under lower operation ranges of the current density D (0.001 amperes/square centimeter to 4 amperes/square centimeter range), the external quantum efficiency of both are lower; and under higher operation ranges of the current density D (20 amperes/square centimeter to 70 amperes/square centimeter range), the external quantum efficiency of both are higher. In addition, along with an increase in the current density D, the effect of the efficiency droop in the external quantum efficiency of both are not as obvious. Therefore, the electron-blocking layer 130 of the light emitting diode having the thickness of the electron-blocking layer 130 falling in the 80 nanometer to 150 nanometer range is suitable for the higher current density operation range. Furthermore, the thickness t of the electron-blocking layer 130 may be designed corresponding to the thickness of the quantum well layer of the light-emitting layer 120. Preferably, the thickness t of the electron-blocking layer 130 falls in the range from 15 times to 40 times the thickness of a single quantum well layer of the light-emitting layer 120.

It is worthy to note, for the light emitting diode having the thickness t of the electron-blocking layer 130 falling in the range from 80 nanometers to 150 nanometers, the current density D corresponding to a peak value of a curve of the external quantum efficiency of the light emitting diode falls in the range from 3 amperes/square centimeter to 10 amperes/square centimeter. In addition, the side length dimension of the light emitting diode corresponding to the aforementioned range falls in the range from 0.2 millimeters to 2 millimeters.

In other words, the light emitting module 10 according to the embodiments of the invention designs the thickness t of the electron-blocking layer 130 in the light emitting diode of the light emitting module 10 according to the different operation ranges of the current density D of the light emitting diode to achieve an ideal external quantum efficiency, further enhancing the luminous efficiency of the light emitting diode. Overall, in an embodiment of the invention, the ratio (ampere/square centimeter-nanometer) of the current density D of the light emitting diode to the thickness t of the electron-blocking layer 130 is larger than 0 and is smaller than or equal to 2, so as to have a more ideal luminous efficiency. More specifically, the current density D of the light emitting diode falls in the range from 0.001 amperes/square centimeter to 4 amperes/square centimeter, and the thickness t falls in the range from 2 nanometers to 30 nanometers, so as to have a more ideal luminous efficiency; and the ratio (ampere/square centimeter-nanometer) of the current density D of the light emitting diode to the thickness t falls in a range from 0.133 to 0.875, the current density D of the light emitting diode falls in the range from 20 amperes/square centimeter to 70 amperes/square centimeter, and the thickness t falls in the range from 80 nanometers to 150 nanometers, so as to have a more ideal luminous efficiency. In this way, the light emitting diode of the light emitting module 10 may have an ideal luminous efficiency under different operation ranges of the current density D of the light emitting diode.

It should be noted, the type of the light emitting diode may be the aforementioned light emitting diode 100a or the light emitting diode 100b, which namely are the lateral light emitting diode or the vertical light emitting diode. The different types of light emitting diodes of the light emitting module in the aforementioned embodiments are only examples, and may also be a flip chip type light emitting diode, however the invention is not limited thereto.

In summary, in a light emitting module of an embodiment of the invention, a thickness of an electron-blocking layer in a light emitting diode of a light emitting module may be designed according to different operation ranges of the current density of the light emitting diode, to achieve a more ideal external quantum efficiency, further enhancing the luminous efficiency of the light emitting diode in the light emitting module. In this way, the light emitting diode in the light emitting module may have an ideal luminous efficiency under different operation ranges of the current density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting module comprising:
    a driving unit; and
    a light emitting diode, electrically connected to the driving unit and the driving unit providing an operating current to make the light emitting diode emit light, the light emitting diode comprising:
        an n-type semiconductor layer;
        a light-emitting layer;
        an electron-blocking layer, the electron-blocking layer having a thickness, and the thickness is smaller than or equal to 30 nanometers or is larger than or equal to 80 nanometers; and
        a p-type semiconductor layer,
    wherein the light-emitting layer is located between the electron-blocking layer and the n-type semiconductor layer, the electron-blocking layer is located between the p-type semiconductor layer and the light-emitting layer, and a ratio (ampere/square centimeter-nanometer) of a current density (ampere/square centimeter) of the light emitting diode to the thickness (nanometer) is larger than 0 and is smaller than or equal to 2.

2. The light emitting module as claimed in claim 1, wherein the current density falls in a range from 0.001 amperes/square centimeter to 4 amperes/square centimeter, and the thickness falls in a range from 2 nanometer to 30 nanometer.

3. The light emitting module as claimed in claim 2, wherein the light-emitting layer is a multiple quantum well structure, the multiple quantum well structure comprises a plurality of quantum well layers and a plurality of quantum barrier layers alternately stacked, and the thickness falls in a range from 0.3 times to 8 times a thickness of a single quantum well layer.

4. The light emitting module as claimed in claim 2, wherein the current density corresponding to a peak value of a curve of an external quantum efficiency of the light emitting diode falls in a range from 0.01 amperes/square centimeter to 3 amperes/square centimeter.

5. The light emitting module as claimed in claim 2, wherein the light emitting diode is a micro light emitting diode, and a side length dimension of the micro light emitting diode falls in a range from 3 microns to 40 microns.

6. The light emitting module as claimed in claim 2, wherein an epitaxial defect density of the light emitting diode falls in a range from $10^3$/square centimeters to $10^8$/square centimeters.

7. The light emitting module as claimed in claim 1, wherein the ratio of the current density to the thickness falls in a range from 0.133 to 0.875, the current density falls in a range from 20 amperes/square centimeter to 70 amperes/square centimeter, and the thickness falls in a range from 80 nanometers to 150 nanometers.

8. The light emitting module as claimed in claim 7, wherein the light-emitting layer is a multiple quantum well structure, the multiple quantum well structure comprises a plurality of quantum well layers and a plurality of quantum barrier layers alternately stacked, and the thickness falls in a range from 15 times to 40 times a thickness of a single quantum well layer.

9. The light emitting module as claimed in claim 7, wherein the current density corresponding to a peak value of a curve of the external quantum efficiency of the light emitting diode falls in a range from 3 amperes/square centimeter to 10 amperes/square centimeter.

10. The light emitting module as claimed in claim 7, wherein a side length dimension of the light emitting diode falls in a range from 0.2 millimeters to 2 millimeters.

11. The light emitting module as claimed in claim 1, wherein the light emitting diode comprises a first electrode and a second electrode, the first electrode is electrically connected to the n-type semiconductor layer, the second electrode is electrically connected to the p-type semiconductor layer, and the driving unit is electrically connected to the n-type semiconductor layer and the p-type semiconductor layer by the first electrode and the second electrode, respectively.

12. The light emitting module as claimed in claim 1, wherein a material of the electron-blocking layer comprises p-type aluminum gallium nitride.

13. The light emitting module as claimed in claim 1, wherein the electron-blocking layer is a superlattice structure.

14. The light emitting module as claimed in claim 1, wherein a material of the n-type semiconductor layer comprises n-type gallium nitride.

15. The light emitting module as claimed in claim 1, wherein a material of the p-type semiconductor layer comprises p-type gallium nitride.

16. The light emitting module as claimed in claim 1, wherein the light-emitting layer comprises a plurality of indium gallium nitride layers and a plurality of gallium nitride layers alternately stacked.

* * * * *